United States Patent
Barkow et al.

(10) Patent No.: US 11,996,349 B2
(45) Date of Patent: May 28, 2024

(54) POWER ELECTRONICS FOR AN ELECTRICAL MACHINE, DRIVETRAIN, MOTOR VEHICLE

(71) Applicant: Dr. Ing. h.c. F. Porsche Aktiengesellschaft, Stuttgart (DE)

(72) Inventors: Maximilian Barkow, Stuttgart (DE); Patrick Fuchs, Leonberg (DE); Sebastian Wachter, Pressig (DE)

(73) Assignee: Dr. Ing. h. c. F. Porsche AG, Stuttgart (DE)

( * ) Notice: Subject to any disclaimer, the term of this patent is extended or adjusted under 35 U.S.C. 154(b) by 560 days.

(21) Appl. No.: 17/180,939

(22) Filed: Feb. 22, 2021

(65) Prior Publication Data

US 2021/0351107 A1    Nov. 11, 2021

(30) Foreign Application Priority Data

May 11, 2020 (DE) ...................... 10 2020 112 655.7

(51) Int. Cl.
  *H05K 7/20* (2006.01)
  *H01L 23/473* (2006.01)
  *H02M 7/00* (2006.01)

(52) U.S. Cl.
  CPC .......... *H01L 23/473* (2013.01); *H02M 7/003* (2013.01); *H05K 7/20936* (2013.01)

(58) Field of Classification Search
  None
  See application file for complete search history.

(56) References Cited

U.S. PATENT DOCUMENTS

| 6,434,003 | B1 * | 8/2002 | Roy | H05K 7/20927 |
| | | | | 174/15.1 |
| 7,015,578 | B2 * | 3/2006 | Nakamura | H01L 24/40 |
| | | | | 257/713 |
| 7,876,561 | B2 * | 1/2011 | Schnetzka | H05K 7/20936 |
| | | | | 361/699 |
| 9,042,100 | B2 * | 5/2015 | Kang | H05K 7/20 |
| | | | | 361/689 |
| 10,791,649 | B2 * | 9/2020 | Dede | H05K 7/20909 |
| 10,985,089 | B2 | 4/2021 | Hart et al. | |
| 2005/0211418 | A1 * | 9/2005 | Kenny | G06Q 20/20 |
| | | | | 257/E23.098 |
| 2006/0022334 | A1 * | 2/2006 | Myers | H01L 29/0657 |
| | | | | 257/E29.022 |
| 2006/0120047 | A1 * | 6/2006 | Inoue | H01L 25/117 |
| | | | | 257/E23.098 |

(Continued)

FOREIGN PATENT DOCUMENTS

| DE | 102015213164 | 1/2017 |
| KR | 101463784 | 11/2014 |

OTHER PUBLICATIONS

Chinese Search Report dated Dec. 29, 2023.

*Primary Examiner* — Courtney L Smith
(74) *Attorney, Agent, or Firm* — Gerald E. Hespos; Michael J Porco

(57) ABSTRACT

An inverter (1) for operating an electrical machine (10) has at least one power semiconductor (2) and a drain contact (5) arranged on an underside of the power semiconductor (2). The drain contact (5) is arranged in a coolant channel (6) for impingement by a coolant. Also proposed are a drivetrain (20) and a motor vehicle (100).

11 Claims, 1 Drawing Sheet

(56) References Cited

U.S. PATENT DOCUMENTS

| | | | |
|---|---|---|---|
| 2007/0063337 A1* | 3/2007 | Schubert | H01L 23/473 |
| | | | 257/E23.098 |
| 2008/0272484 A1* | 11/2008 | Myers | H01L 23/473 |
| | | | 257/E23.098 |
| 2008/0272485 A1* | 11/2008 | Myers | H01L 25/117 |
| | | | 257/E23.098 |
| 2016/0307822 A1* | 10/2016 | Usui | H01L 23/49562 |
| 2021/0175144 A1* | 6/2021 | Ruppert | H01L 25/16 |

* cited by examiner

POWER ELECTRONICS FOR AN ELECTRICAL MACHINE, DRIVETRAIN, MOTOR VEHICLE

CROSS REFERENCE TO RELATED APPLICATION

This application claims priority under 35 USC 119 to German Patent Appl. No. 10 2020 112 655.7 filed on May 11, 2020, the entire disclosure of which is incorporated herein by reference.

BACKGROUND

Field of the Invention

The invention relates to power electronics for an electrical machine for feeding electrical voltages and/or currents to the electrical machine. The invention also relates to a drivetrain comprising power electronics and an electrical machine, and to a motor vehicle.

Related Art

A polyphase AC voltage must be made available to an electrical machine so that the electrical machine can operate. Usually, and particularly in the case of electrical machines for traction of motor vehicles, the AC voltage is converted from a DC voltage by an inverter. The inverter converts torque requirements of a control unit of the motor vehicle into electrical voltages, which in turn result in electrical currents.

An inverter usually comprises three components: a power part, a gate driver and a controller. The power part typically comprises power semiconductors for inverting the voltage. The power part also usually comprises a link capacitor for energetic coupling and sensors for detecting the electrical voltages and electrical currents. The controller performs closed-loop control of the electrical machine and calculates the electrical voltages to be set. The latter are then converted into switching signals by means of a modulation method, for example pulse width modulation or space vector modulation, and the signals are conducted to the gate driver. The gate driver controls the power semiconductors of the power part on the basis of the switching signals.

The power semiconductors usually are arranged on a so-called direct bonded copper stack. A stack typically comprises at least three layers, arranged one above another. An electrically conductive upper layer bears against the power semiconductor and electrically contacting the power semiconductor to serve as a drain contact. A central layer is arranged between the upper layer, which is normally produced from copper, and an electrically conductive lower layer, which also normally is produced from copper. The central layer is electrically nonconductive and can consist, for example, of a ceramic of silicon nitride or aluminum oxide. The central layer functions to insulate the power semiconductor toward the bottom. Provision usually is made for a coolant to impinge on the lower layer to cool the power semiconductor during operation. For the purpose of cooling the power semiconductor, a heat path thus arises from the power semiconductor via the upper layer, the central layer and the lower layer to the coolant.

The above-described stack has a long and inefficient heat path for cooling the power semiconductor. This inefficiency during cooling can result in the power semiconductors overheating in the event of permanently high powers, and the power may have to be reduced.

It is therefore an object of the invention to provide an inverter that does not have the described disadvantages of the prior art, but rather enables the power semiconductors to be cooled very efficiently.

SUMMARY

This object is achieved by an inverter for operating an electrical machine comprising at least one power semiconductor and a drain contact arranged on an underside of the power semiconductor. The drain contact is arranged in a coolant channel for impingement by a coolant. The direct impingement on the drain contact enables the heat path to be shortened. Heat to be dissipated from the power semiconductor does not first have to be conducted via a plurality of layers, in particular not through a ceramic layer having poor thermal conductivity. The inverter of the invention can be made without a stack, such as a direct bonded copper stack. This makes the production of the inverter simpler and more cost-effective.

In accordance with one embodiment, a gate contact is arranged on the top side of the power semiconductor and a source contact is arranged on the top side of the power semiconductor. The gate contact and/or the source contact are arranged in the coolant channel for impingement by the coolant. This enables the cooling of the power semiconductor to be improved further. Within the meaning of the present invention, the top side and the underside are oppositely arranged sides of the power semiconductor. No restriction with regard to their position in space relative to Earth's gravitational force is given by the designation "top side" and "underside".

In accordance with a further embodiment, the inverter comprises a cooling device for cooling the drain contact and preferably the gate contact and/or the source contact. The cooling device is suitable for impingement on the drain contact and preferably the gate contact and/or the source contact by a coolant. The cooling device enables heat to be dissipated via the coolant. The cooling device may comprise a heat exchanger and a coolant pump. The coolant to be a fluid, such as a liquid.

In one embodiment, the inverter comprises a dielectric as coolant. A dielectric is electrically nonconductive and thus serves as insulation of the drain contact and preferably of the source contact and/or of the gate contact.

A sheath, such as a plastic sheath, may enclose the power semiconductor. Thus, the sensitive structure of the power semiconductor is protected. It is conceivable for the power semiconductor to be encapsulated in plastic by molding. It is furthermore conceivable for the sheath to have securing devices, for example clips, for securing the power semiconductor in the coolant channel.

In accordance with a further embodiment, the drain contact may comprise a cooling structure projecting into the coolant channel. The cooling structure may be a lamellar structure and/or as a pin-fin structure. The cooling structure enlarges the surface area on which the coolant impinges to achieve even more efficient cooling of the power semiconductor. The gate contact also may comprise a first further cooling structure projecting into the coolant channel, and the first further cooling structure may be a lamellar structure and/or a pin-fin structure. The source contact may comprise a second further cooling structure projecting into the coolant channel, and the second further cooling structure may be a lamellar structure and/or as a pin-fin structure.

In accordance with a further embodiment, the drain contact may comprise a conductor rail, preferably a conductor rail composed of copper or aluminum. The gate contact and/or the source contact similarly may comprise a conductor rail, in particular composed of copper or aluminum. Conductor rails are very highly suitable for the connection of the power semiconductor and for operation with high continuous powers.

The power semiconductor may be an SiC semiconductor. By virtue of the high electron mobility in silicon carbide, SiC semiconductors enable extremely high switching speeds with very low switching losses.

The invention may comprise a drivetrain, in particular a drivetrain for a motor vehicle, comprising an electrical machine and an inverter as described above.

The invention may relate to a motor vehicle comprising a drivetrain according to the invention.

All details, features and advantages disclosed above in association with the can likewise relate to the inverter according to the invention, the drivetrain according to the invention and the motor vehicle according to the invention.

Further details, features and advantages of the invention are evident from the drawings and from the following description of preferred embodiments with reference to the drawings. In this case, the drawings merely illustrate exemplary embodiments of the invention which do not restrict the concept of the invention.

DETAILED DESCRIPTION

Figure 1:
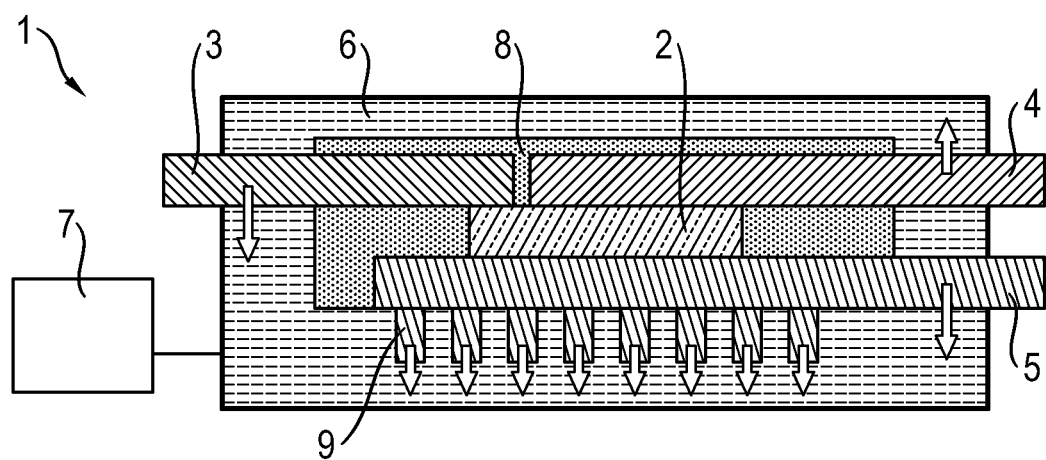
FIG. 1 schematically illustrates an inverter in accordance with one exemplary embodiment of the present invention.

FIG. 1 illustrates an inverter 1 for operating an electrical machine (see FIG. 2) in accordance with one embodiment of the invention. The inverter 1 comprises a power semiconductor 2 embodied here as an SiC semiconductor. A gate contact 3 and a source contact 4 are arranged at the top side of the power semiconductor 2. The gate contact 3 and the source contact 4 in this embodiment are busbars composed of copper. Alternatively, the gate contact 3 and/or the source contact 4 can be made from aluminum.

A drain contact 5 is arranged on an underside of the power semiconductor 2 opposite the top side. The drain contact 5 also is embodied here as a busbar composed of copper and can alternatively be produced from aluminum. The drain contact 5 is arranged in a coolant channel 6 of the inverter 1. An electrically nonconductive coolant, preferably a dielectric, is pumped through the coolant channel 6. For this purpose, a cooling device 7 of the inverter 1 comprises a coolant pump. The use of an electrically nonconductive coolant makes it possible to omit an insulator, for example a ceramic layer below the drain contact 5.

The gate contact 3 and the source contact 4 also are impinged on by the coolant to achieve very efficient cooling of the power semiconductor 2. For further improvement of the cooling, the drain contact 5 comprises a cooling structure 9, preferably in the form of a pin-fin structure or a lamellar structure. The cooling structure enlarges the surface area on which the coolant impinges, and thus enables more heat to be dissipated. The heat path is illustrated by arrows in FIG. 1.

To protect the sensitive structures of the power semiconductor 2, the power semiconductor 2 is encapsulated by molding in a sheath 8 composed of plastic. This prevents the coolant from coming into direct contact with the power semiconductor 2.

Figure 2:
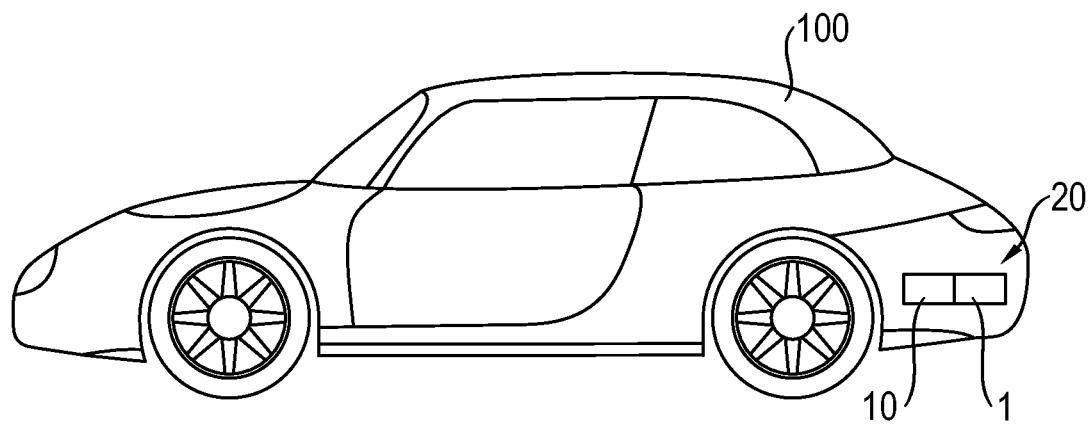
FIG. 2 schematically illustrates a motor vehicle in accordance with one exemplary embodiment of the present invention comprising a drivetrain in accordance with one exemplary embodiment of the present invention.

FIG. 2 schematically illustrates a motor vehicle 100 in accordance with one embodiment of the invention comprising a drivetrain 20 in accordance with one embodiment of the invention. The drivetrain 20 comprises an inverter 1 in accordance with an embodiment of the invention and an electrical machine 10.

What is claimed is:

1. An inverter for operating an electrical machine (10), comprising:
    at least one power semiconductor having opposite first and second sides;
    a drain contact arranged on the first side of the power semiconductor;
    a gate contact arranged on the second side of the power semiconductor;
    a source contact arranged on the second side of the power semiconductor;
    a plastic sheath enclosing the power semiconductor and enclosing portions of the drain contact, the gate contact and the source contact;
    a coolant channel surrounding the plastic sheath and surrounding parts of the drain contact, the gate contact and the source contact that project beyond the plastic sheath; and
    a cooling device communicating with the coolant channel and configured for pumping a coolant through the cooling channel and impinging on opposite sides of the drain contact, the gate contact and the source contact.

2. The inverter of claim 1, wherein the inverter comprises a dielectric as coolant.

3. The inverter of claim 1, wherein the drain contact comprises a cooling structure projecting into the coolant channel.

4. The inverter of claim 3, wherein the cooling structure includes a lamellar structure.

5. The inverter of claim 3, wherein the cooling structure includes a pin-fin structure.

6. The inverter of claim 1, wherein the drain contact comprises a conductor rail.

7. The inverter of claim 1, wherein the conductor rail comprises copper or aluminum.

8. The inverter of claim 1, wherein at least one of the gate contact and the source contact comprise a conductor rail that comprises copper or aluminum.

9. The inverter of claim 1, wherein the power semiconductor is an SiC semiconductor.

10. A drivetrain for a motor vehicle, comprising an electrical machine and the inverter of claim 1.

11. A motor vehicle comprising the drivetrain of claim 10.

* * * * *